United States Patent [19]
Lee et al.

[11] Patent Number: 5,430,772
[45] Date of Patent: Jul. 4, 1995

[54] BIT SYNCHRONIZER FOR NRZ DATA

[75] Inventors: Bhum C. Lee; Kwon C. Park; Hang G. Bahk, all of Daejeon, Rep. of Korea

[73] Assignees: Electronics and Telecommunications Research Institute; Krea Telecommunication Authority, both of Seoul, Rep. of Korea

[21] Appl. No.: 33,175

[22] Filed: Mar. 16, 1993

[30] Foreign Application Priority Data

Mar. 18, 1992 [KR] Rep. of Korea ............... 1992-4480

[51] Int. Cl.⁶ ............................................. H04L 7/00
[52] U.S. Cl. .................................. 375/363; 341/68; 375/362; 375/376; 327/2
[58] Field of Search ............... 375/111, 112, 116, 118, 375/119, 120; 307/510, 511; 455/276; 341/68, 99

[56] References Cited

U.S. PATENT DOCUMENTS 4,611,336 9/1986 Fryer ........................ 375/111 X
4,965,814 10/1990 Yoshida et al. ............ 375/118 X

*Primary Examiner*—Stephen Chin
*Assistant Examiner*—Bryan E. Webster
*Attorney, Agent, or Firm*—Blakely, Sokoloff, Taylor & Zafman

[57] ABSTRACT

A bit synchronizer for NRZ data wherein a loop gain of a phase locked loop in the bit synchronizer is not varied sensitively to bit pattern and rate of the NRZ data and a voltage control led oscillator in the bit synchronizer oscillates synchronously with a multiple of a frequency of an external reference clock pulse even in the absence of NRZ data transitions or over a wide range of variation of a clock frequency of the voltage controlled oscillator, so that the NRZ data and clock can be recovered stably, According to the invention, the bit synchronizer comprises a phase comparator, a first gain controller, a frequency comparator, a second gain controller, a N-frequency divider, a low pass filter and a voltage controlled oscillator.

9 Claims, 8 Drawing Sheets

BIT SYNCHRONIZER FOR NRZ DATA

BACKGROUND OF THE INVENTION

1. Field of the Invention

The present invention relates in general to bit synchronizers, and more particularly to a bit synchronizer for non-return to zero (NRZ) data wherein a loop gain of a phase locked loop (PLL) in the bit synchronizer is not varied sensitively to bit pattern and rate of the NRZ data and a voltage controlled oscillator in the bit synchronizer oscillates synchronously with a multiple of a frequency of an external reference clock pulse even in the absence of NRZ data transitions or over a wide range of variation of a clock frequency of the voltage controlled oscillator, so that the NRZ data and clock can be recovered stably.

2. Description of the Prior Art

Referring to FIG. 1, there is shown a block diagram of a conventional bit synchronizer. In this drawing, the conventional bit synchronizer is shown to comprise a phase comparator (PC) 11, a low pass filter (or an integrator) 12 and a voltage control led oscillator (VCO) 13.

In the conventional bit synchronizer, as shown in FIG. 1, an output of the phase comparator (referred to hereinafter as "PC") 11 is connected directly to an input of the low pass filter (or the integrator) 12. Examples of this form of bit synchronizer are described in U.S. Pat. No. 4,400,667, Belkin, U.K. Patent No. 8039874 and U.S. Pat. No. 4,422,276, Summers, and U.S. Pat. No. 4,535,459, Hogge. It is also common that a loop gain of a phase locked loop (PLL) is varied sensitively to a bit pattern of the received NRZ data (probability that NRZ data transitions will occur) since the output of the PC for bit synchronization is varied as a function of the number of the NRZ data transitions (a gain of the PC is varied as a function of a density of the NRZ data transitions). One example of this form of bit synchronizer is shown in D. L. Duttweiler, "The Jitter Performance of Phase-Locked Loops Extracting Timing from Baseband Data Waveforms", The Bell System Technical Journal, Jan 1976. For this reason, making the loop gain of the PLL circuit larger causes the unstable operation of the bit synchronizer when a large number of the data transitions occur. Also, making the loop gain of the PLL circuit smaller causes the unstable operation of the bit synchronizer when a small number of the data transitions occur.

Also in the conventional bit synchronizer, the low pass filter or the integrator 12 of the PLL detects a magnitude of a low frequency component containing a DC component from the output pulse from the PC 11. The detected magnitude from the low pass filter or the integrator 12 is then applied to the voltage controlled oscillator (referred to hereinafter as "VCO") 13. In the case where the output pulse from the PC 11 is of a narrow width (the bit rate of the data is high), the low frequency component is of such a very small magnitude not as to detect it. This results in the unstable operation of the PLL circuit. Examples of this form of bit synchronizer are described in U.S. Pat. No. 4,400,667, Belkin, U.K. Patent No. 8039874 and U.S. Pat. No. 4,422,276, Summers, and U.S. Pat. No. 4,535,459, Hogge.

In order to solve the above problems, there have recently been proposed several bit synchronizers. In one of the proposed bit synchronizers, there is provided a separate PLL for monitoring the VCO frequency, in addition to the bit synchronizing PLL for data recovery. The bit synchronization is performed by separating the frequency and the phase from each other. One example of this form of bit synchronizer is described in U.S. Pat. No. 4,787,079, R. P. Rizzo. In another bit synchronizer, the PLL comprises both the low pass filter and the integrator which controls the VCO simultaneously to enhance the bit-synchronizing performance. One example of this form of bit synchronizer is described in Japanese Patent No. Sho 53-153494 and U.S. Pat. No. 4,942,370, T. Shigemori. With the above proposed bit synchronizers, however, the above-mentioned conventional problems cannot basically be solved in that the output of the PC or a frequency comparator (FC) is connected directly to the input of the low pass filter or the integrator 12.

SUMMARY OF THE INVENTION

Therefore, the present, invention has been made in view of the above problems, and it is an object of the present invention to provide a bit synchronizer for non-return to zero (NRZ) data. The bit synchronizer circuit comprises a phase locked loop (PLL). By appropriately controlling the gain of a phase comparator (PC), the loop gain of the PLL is not affected by the bit patterns of the received NRZ data. In order to operate the PLL stably, the PC outputs a pulse waveform having a pulse width that is not affected by the bit rate of the received NRZ data. To recover stably the NRZ data and a clock pulse, the bit synchronizer circuit uses a voltage controlled oscillator (VCO). When there is an absence of NRZ data, the VCO oscillates synchronously with a multiple of a frequency of an external reference clock pulse. Otherwise, the VCO oscillates synchronously with a frequency within a wide range of clock frequencies.

In accordance with one aspect of the present invention, there is provided a bit synchronizer for NRZ data comprising: voltage controlled oscillating means; phase comparing means for comparing a phase of a transition of the received NRZ data with a phase of a rising transition of a clock pulse from said voltage controlled oscillating means being synchronized with the NRZ data bit, outputting the resultant pulse information only when the transition is present in the received NRZ data, retiming the NRZ data at the bit synchronized clock pulse of said voltage controlled oscillating means and outputting the retimed NRZ data; first gain control means connected to said phase comparing means, said first gain control means limiting a gain of said phase comparing means to a predetermined value when the gain of said phase comparing means is greater than or equal to the predetermined value since a density of the NRZ data transitions is greater than or equal to a predetermined probability, doing not limit the gain of said phase comparing means when the gain of said phase comparing means is smaller than the predetermined value since the density of the NRZ data transitions is smaller than the predetermined probability, wave-shaping the pulse information from said phase comparing means into a pulse waveform having a pulse width irrelevant to a bit rate of the NRZ data and outputting the wave-shaped pulse signal; frequency comparing means for comparing a multiple of one-half period of an external reference clock pulse with a multiple of a period of the clock pulse from said voltage controlled oscillating means and outputting the resultant pulse information only when a transition is present in the reference clock pulse; second gain control means connected to said frequency comparing means, said second gain control means limiting a gain of said frequency comparing means to a predetermined value when the gain of said frequency comparing means is greater than or equal to the predetermined value, doing not limit the gain of said frequency comparing means when the gain of said frequency comparing means is smaller than the predetermined value, wave-shaping the pulse information from said frequency comparing means into a pulse waveform having a pulse width irrelevant to a frequency of the reference clock pulse and a frequency of the clock pulse from said voltage controlled oscillating means and outputting the wave-shaped pulse signal; means connected to said first and second gain control means, for low pass filtering or integrating outputs of said first and second gain control means; said voltage controlled oscillating means changing the phase and frequency of the clock pulse thereof in response to an output voltage from said low pass filtering or integrating means and outputting the resultant clock pulse to said phase comparing means and said frequency comparing means; and N-frequency dividing means connected to said voltage controlled oscillating means and said first and second gain control means, said N-frequency dividing means dividing the clock pulse from said voltage controlled oscillating means by N (natural number) and outputting the resultant clock pulse to said first and second gain control means.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
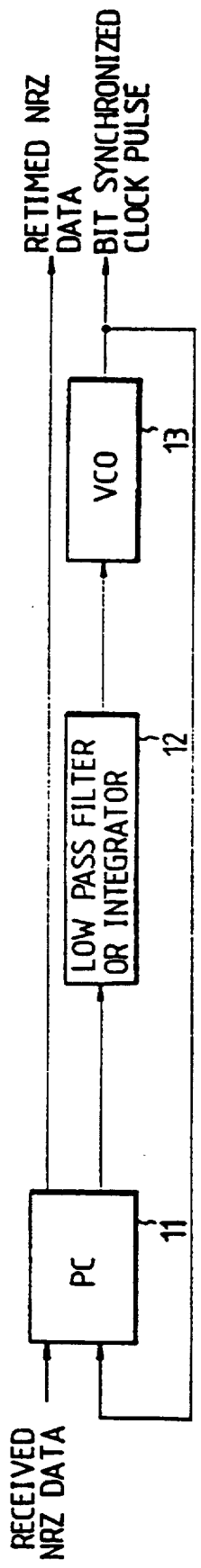
FIG. 1 is a block diagram of a conventional bit, synchronizer.
Figure 2:
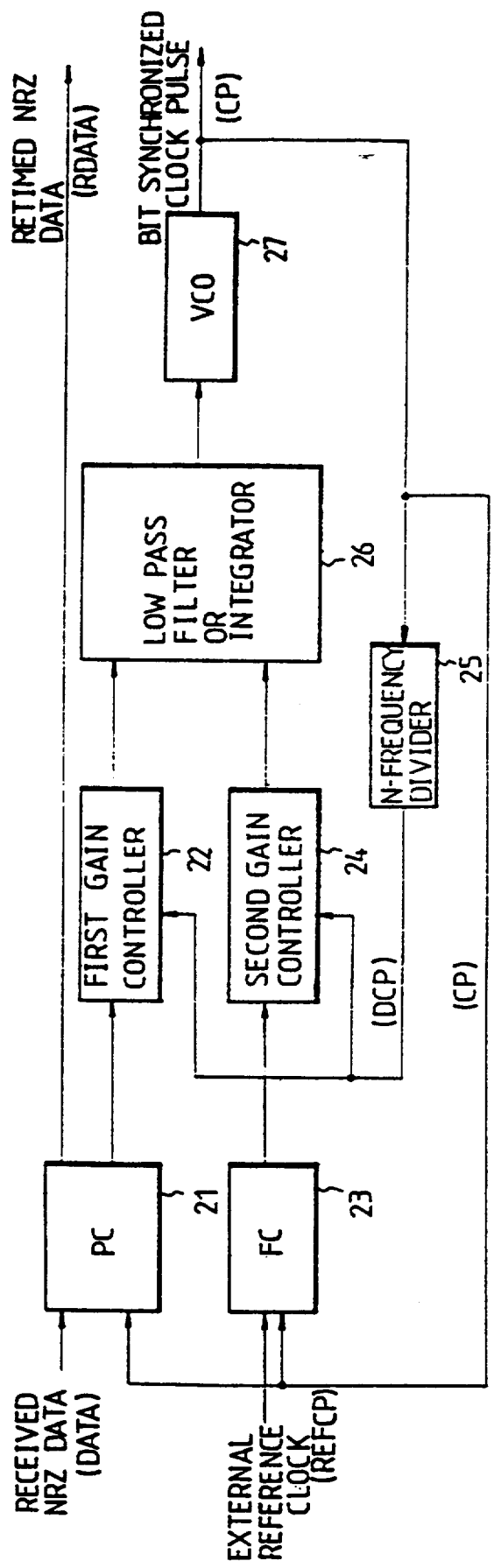
FIG. 2 is a block diagram of a bit synchronizer accordance with the present invention.

Referring to FIG. 2, there is shown a block diagram illustrating schematically a bit synchronizer of the present invention. In this drawing, the reference numeral 21 designates a phase comparator (referred to hereinafter as "PC"), 22 a first gain controller, 23 a frequency comparator (referred to hereinafter as "FC"), 24 a second gain controller, 25 a N-frequency divider, 26 a low pass filter (or an integrator) and 27 a voltage controlled oscillator (referred to hereinafter as "VCO"), respectively.

As shown in FIG. 2, the bit synchronizer for NRZ data of the present invention comprises the PC 21, the first and second gain control lets 22 and 24, the FC 23, the N-frequency divider 25, the low pass filter (or the integrator) 26 and the VCO 27.

The PC 21 is connected to an output of the VCO 27 and an input of the first gain controller 22 to detect the phase relationship between the center of the received NRZ data "eye" and a rising transition of a clock pulse CP from the VCO 27 being synchronized with the NRZ data bit. Only when a transition is present in the received NRZ data, the detected phase relationship from the PC 21 is applied to the input of the first gain controller 22 as a logical level and a latch clock pulse for latching the logical level. The PC 21 also retimes the NRZ data at the bit synchronized clock pulse CP and outputs the retimed NRZ data RDATA.

The first gain controller 22 is connected to an output of the PC 21, an output of the N-frequency divider 25 and an input of the low pass filter (or the integrator) 26 to act such that a gain of the PC 21 is not varied sensitively to the number of the NRZ data transitions. To this end, the first gain control let 22 uses a clock pulse DCP from the N-frequency divider 25 which divides the clock pulse CP from the VCO by N. In the first gain controller 22, the PC gain is controlled by setting the maximum PC gain value (the minimum pulse generation period). The first gain controller 22 also wave-shapes a pulse waveform representative of the phase relationship between the center of the received NRZ data "eye" and the rising transition of the clock pulse CP from the VCO 27 such that the phase relationship representative pulse waveform is of a pulse width irrelevant to a bit rate of the NRZ data, and outputs the wave-shaped pulse signal to the low pass filter (or the integrator) 26.

The FC 23 is connected to a reference clock pulse REFCP, the output of the VCR 27 and an input of the second gain controller 24 to detect the frequency relationship between a multiple of one-half period of the reference clock pulse REFCP and a multiple of a period of the clock pulse CP from the VCO 27. Only when a transition is present in the reference clock pulse REFCP, the detected frequency relationship from the FC 23 is applied to the input of the second gain controller 24 as a logical level and a latch clock pulse for latching the logical level.

The second gain controller 24 is connected to an output of the FC 23, the output of the N-frequency divider 25 and the input of the low pass filter (or the integrator) 26 to act such that a PLL circuit operates properly. To this end, the second gain controller 24 uses the clock pulse DCP from the N-frequency divider 25 which divides the clock pulse CP from the VCO by N. The second gain controller 24 also wave-shapes the output information from the FC 23 such that the information is of a pulse width irrelevant to a frequency of the reference clock pulse REFCP and a frequency of the clock pulse CP from the VCO 27, and outputs the wave-shaped pulse signal to the low pass filter (or the integrator) 26.

The N-frequency divider 25 is connected to the VCO 27 and the first and second gain controllers 22 and 24 to divide the clock pulse CP from the VCO by N and output the resultant clock pulse DCP to the first and second gain controllers 22 and 24.

The low pass filter (or the integrator) 26 is connected to an input of the VCO 27, an output of the first gain control let 22 and an output of the second gain controller 24 to low pass filter (or integrate) the outputs of the first and second gain controllers 22 and 24 and output the resultant low frequency component voltage including a DC component to the VCO 27. The output voltage from the low pass filter or integrator 26 is the low frequency component voltage including the DC component which is varied depending on the phase relationship between the center of the received NRZ data "eye" and the rising transition of the clock pulse CP from the VCO 27 and the frequency relationship between the frequency of the clock pulse CP from the VCO 27 and the frequency of the reference clock pulse REFCP.

The VCO 27 is connected to the low pass filter (or the integrator) 26, the N-frequency divider 25, the PC 21 and the FC 23 to change the phase and frequency of the output clock pulse CP in response to the output voltage from the low pass filter (or the integrator) 26 and output the resultant clock pulse CP to the PC 21 and the FC 23. The output clock pulse CP from the VCO 27 is synchronized with the NRZ data bit and the reference clock pulse frequency.

Figure 3:
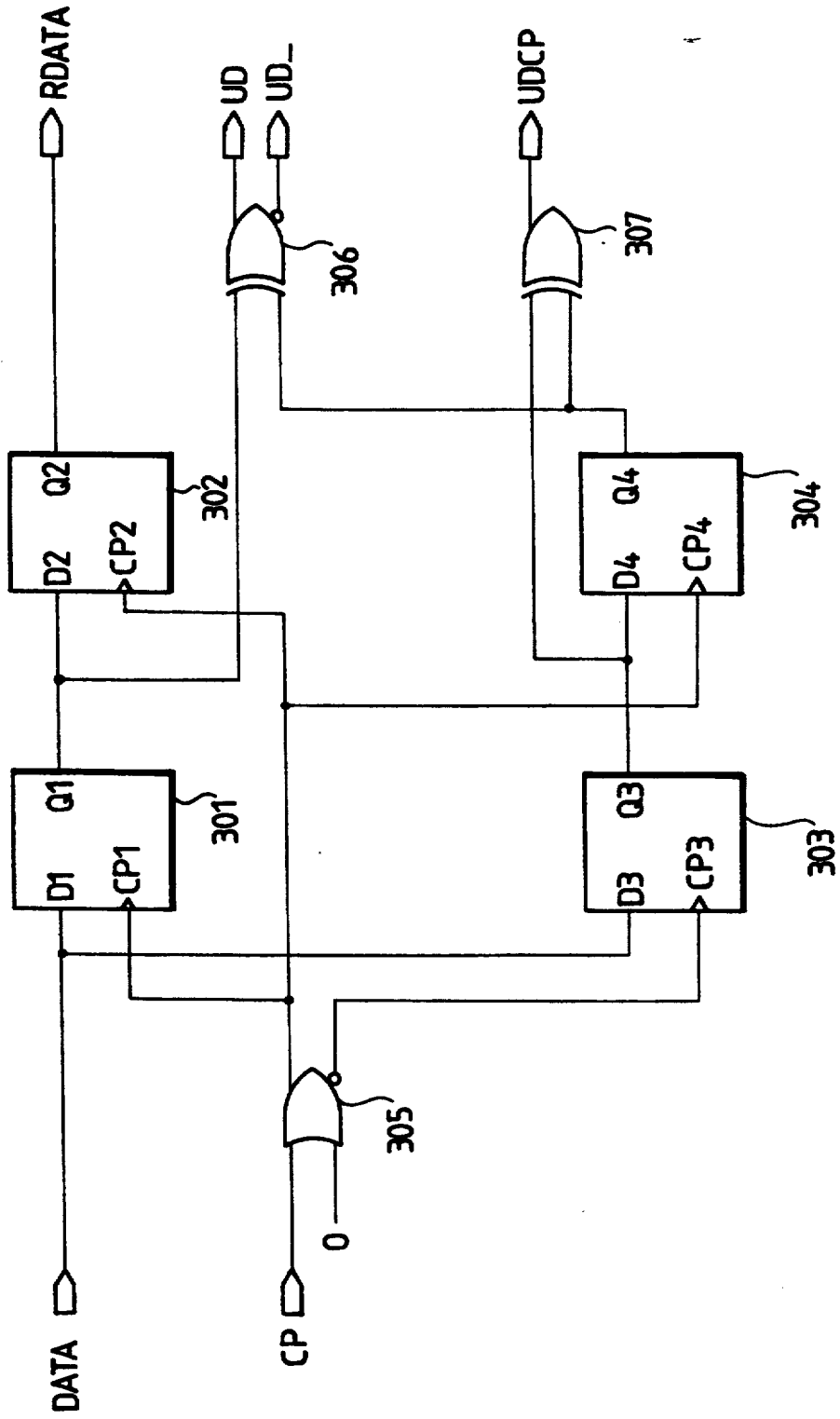
FIG. 3 is a functional block diagram of a phase comparator in FIG. 2.

Referring to FIG. 3, there is shown a functional block diagram of the PC 21 in FIG. 2. As shown in this drawing, the PC 21 includes D flip-flops 301, 302, 303 and 304, a two-input OR and NOR gate 305, an exclusive OR and NOR gate and an exclusive OR gate 307.

The two-input OR and NOR gate 305 has its one input terminal for inputting the output (CP) from the VCO 27 and its other input terminal fixed at a logical level "0".

The D flip-flop 301 has its data input terminal D1 for inputting the NRZ data and its clock pulse input terminal CP1 for inputting a clock pulse from the two-input OR and NOR gate 305, the clock pulse being in phase with the clock pulse CP from the VCO 27.

The D flip-flop 303 has its data input terminal D3 for inputting the NRZ data and its clock pulse input terminal CP3 for inputting a clock pulse from the two-input OR and NOR gate 305, the clock pulse being 180° out of phase with the clock pulse CP from the VCO 27.

The D flip-flop 304 has its data input terminal D4 for inputting an output Q3 of the D flip-flop 303 and its clock pulse input terminal CP4 for inputting the clock pulse from the two-input OR and NOR gate 305 which is in phase with the clock pulse CP from the VCO 27.

The D flip-flop 302 has its data input terminal D2 for inputting an output Q1 of the D flip-flop 301 and its clock pulse input terminal CP2 for inputting the clock pulse from the two-input OR and NOR gate 305 which is in phase with the clock pulse CP from the VCO 27.

The exclusive OR gate 307 inputs the output Q3 of the D flip-flop 303 and an output Q4 of the D flip-flop 304 at its two input terminals, respectively.

The exclusive OR and NOR gate 306 inputs the outputs Q1 and Q4 of the D flip-flops 301 and 304 at its two input terminals, respectively.

The operation of the PC 21 of the construction in FIG. 3 will hereinafter be described in detail with reference to FIGS. 4A and 4B which are timing diagrams of the signals from the components in FIG. 3.

Figure 4A:
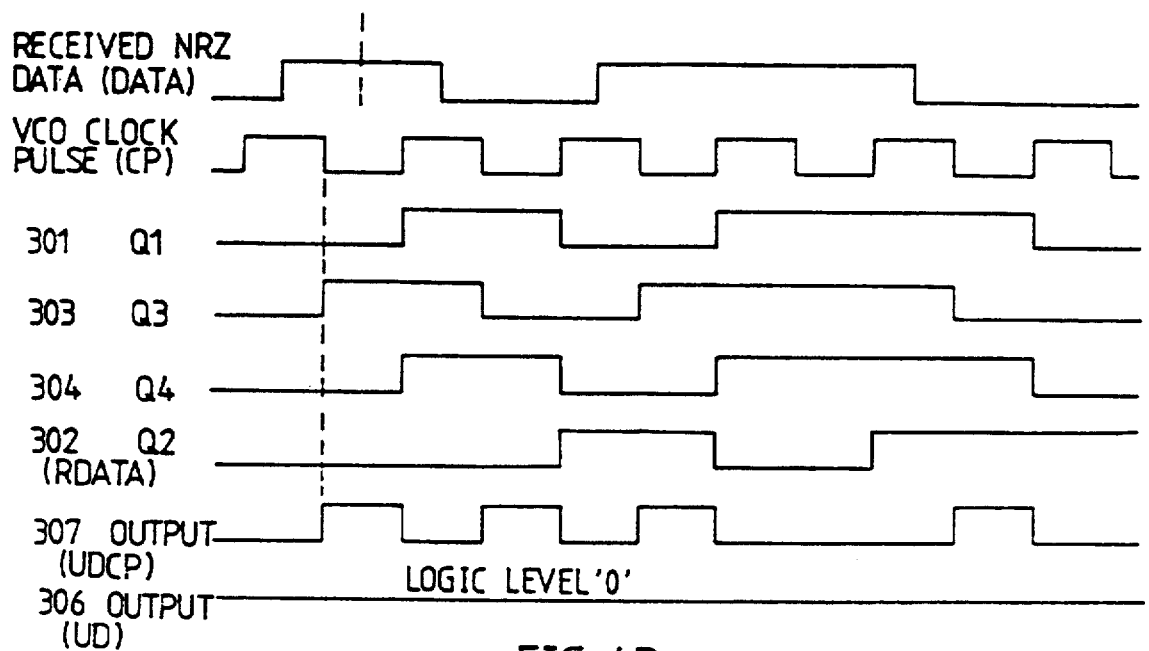
FIGS. 4A and 4B are timing diagrams of signals from components in the phase comparator in FIG. 3.
Figure 4B:
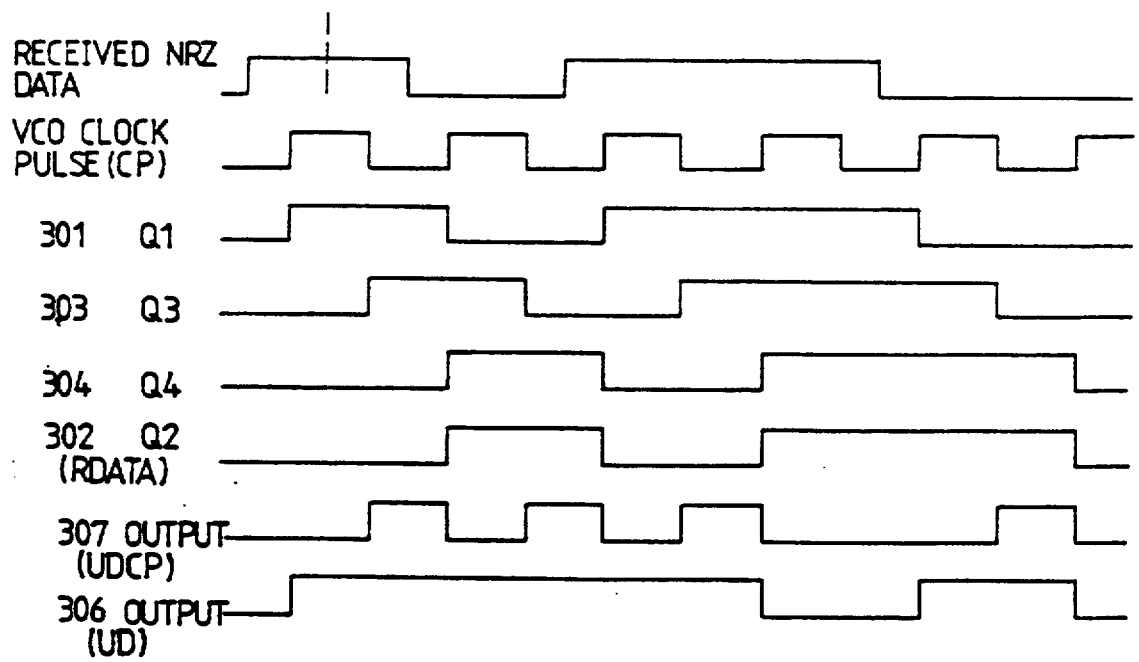

FIG. 4A illustrates the case where the rising transition of the clock pulse CP from the VCO 27 follows the center of the NRZ data "eye" and FIG. 4B illustrates the case where the rising transition of the clock pulse CP from the VCO 27 precedes the center of the NRZ data "eye". The case where the rising transition of the clock pulse CP from the VCO 27 follows the center of the NRZ data "eye" will hereinafter be described with reference to FIG. 4A.

There is no phase difference between the data Q4 obtained by retiming the data Q3, retimed at the clock pulse which is 180° out of phase with the clock pulse CP from the VCO 27, at the clock pulse which is in phase with the clock pulse CP and the data Q1 retimed at the clock pulse which is in phase with the clock pulse CP. The data Q1 and Q4 are exclusive ORed by the exclusive OR and NOR gate 306, an exclusive ORed output UD of which remains at a logical level "0". Also, the data Q3 retimed at the clock pulse which is 180° out of phase with the clock pulse CP from the VCO 27 and the data Q4 retimed at the clock pulse which is in phase with the clock pulse CP always have the phase difference therebetween by one-half period of the clock pulse CP. As a result, whenever a transition is present in the NRZ data, the exclusive OR gate 307 outputs at its output UDCP a pulse signal having a pulse width of one-half period of the clock pulse CP from the VCO 27. In this connection, when a rising transition is present in the output UDCP of the exclusive OR gate 307, the exclusive ORed output UD of the exclusive OR and NOR gate 306 is logical "0" and an exclusive NORed output/UD thereof is logical "1".

The case where the rising transition of the clock pulse CP from the VCO 27 precedes the center of the NRZ data "eye" will hereinafter be described with reference to FIG. 4B.

Between the data Q4 obtained by retiming the data Q3, retimed at the clock pulse which is 180° out of phase with the clock pulse CP from the VCO 27, at the clock pulse which is in phase with the clock pulse CP and the data Q1 retimed at the clock pulse which is in phase with the clock pulse CP is the phase difference by a period of the clock pulse CP. As a result, whenever a transition is present in the data Q1 retimed at the clock pulse which is in phase with the clock pulse CP from the VCO 27, the exclusive OR and NOR gate 306 outputs at its exclusive ORed output UD a pulse signal having a logical level "1" for a period of the clock pulse CP from the VCO 27. Also, the data Q3 retimed at the clock pulse which is 180° out of phase with the clock pulse CP from the VCO 27 and the data Q4 retimed at the clock pulse which is in phase with the clock pulse CP always have the phase difference therebetween by one-half period of the clock pulse CP. As a result, whenever a transition is present in the NRZ data, the exclusive OR gate 307 outputs at its output UDCP a pulse signal having a pulse width of one-half period of the clock pulse CP from the VCO 27. At this time, a rising transition of the pulse at the output UDCP of the exclusive OR gate 307 occurs in the center of the pulse width at the output UD of the exclusive OR and NOR gate 306. In this connection, when the rising transition is present in the output UDCP of the exclusive OR gate 307, the exclusive ORed output UD of the exclusive OR and NOR gate 306 is logical "1" and the exclusive NORed output/UD thereof is logical "0".

Figure 5:
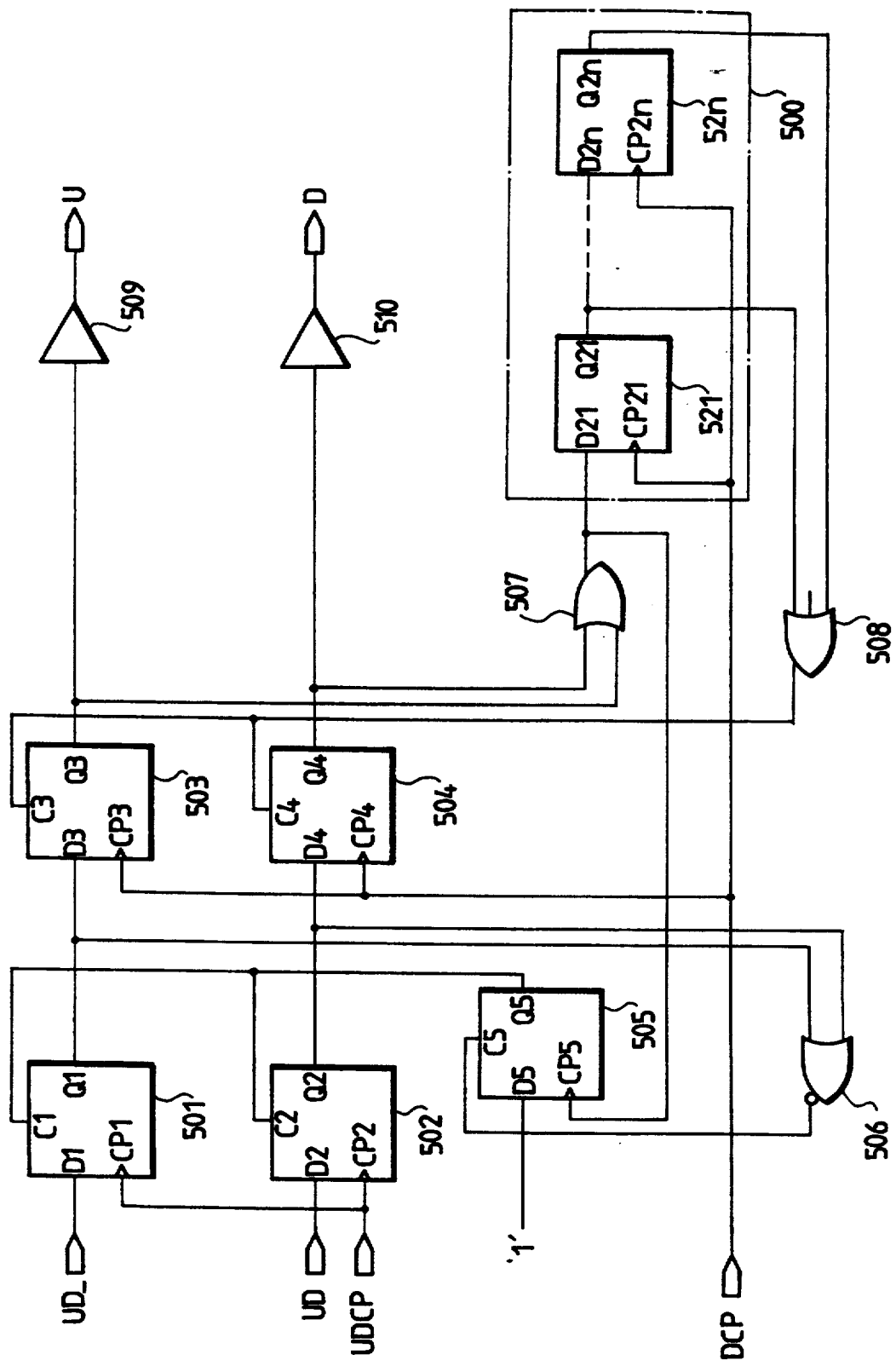
FIG. 5 is a functional block diagram of a first gain controller in FIG. 2.

Referring to FIG. 5, there is shown a functional block diagram of the first gain controller 22 in FIG. 2. As shown in this drawing, the first gain controller 22 includes a n-bit (n is a natural number) shift register 500, D flip-flops 501-505, a two-input NOR gate 506, a two-input OR gate 507, a n-input (n is a natural number) OR gate 508 and output buffers 509 and 510.

The D flip-flop 501 has its data input terminal D1 for inputting the exclusive NORed output /UD of the exclusive OR and NOR gate 306 in the PC 21 and its clock pulse input terminal CP1 for inputting the output UDCP of the exclusive OR gate 307 in the PC 21.

The D flip-flop 502 has its data input terminal D2 for inputting the exclusive ORed output UD of the exclusive OR and NOR gate 306 in the PC 21 and its clock pulse input terminal CP2 for inputting the output UDCP of the exclusive OR gate 307 in the PC 21.

The D flip-flop 503 has its data input terminal D3 for inputting an output Q1 of the D flip-flop 501 and its clock pulse input terminal CP3 for inputting the output DCP of the N-frequency divider 25.

The D flip-flop 504 has its data input terminal D4 for inputting an output Q2 of the D flip-flop 502 and its clock pulse input terminal CP4 for inputting the output DCP of the N-frequency divider 25.

The two-input NOR gate 506 inputs the outputs Q1 and Q2 of the D flip-flops 501 and 502 at its two input terminals, respectively.

The two-input OR gate 507 inputs outputs Q3 and Q4 of the D flip-flops 503 and 504 at its two input terminals, respectively.

The D flip-flop 505 has its clear input terminal C5 for inputting an output of the two-input NOR gate 506, its clock pulse input terminal CP5 for inputting an output of the two-input OR gate 507, its data input terminal D5 fixed at a logical level "1" and its output Q5 connected to clear input terminals C1 and C2 of the D flip-flops 501 and 502.

The n-bit shift register 500 has n D flip-flops 52$l$–52$n$ (n is a natural number) each having its data input terminal D2$l$–D2$n$ for inputting the output of the two-input OR gate 507 and its clock pulse input terminal CP2$l$–CP2$n$ for inputting the output DCP of the N-frequency divider 25.

The n-input OR gate 508 has its n input terminals for inputting n outputs Q2$l$–Q2$n$ of the n-bit shift register 500 and its output connected to clear input terminals C3 and C4 of the D flip-flops 503 and 504.

The output buffer 509 has its input terminal for inputting the output Q3 of the D flip-flop 503 and its output U connected to the input of the low pass filter (or the integrator) 26.

The output buffer 510 has its input terminal for inputting the output Q4 of the D flip-flop 504 and its output D connected to the input of the low pass filter (or the integrator) 26.

The operation of the first gain controller 22 of the construction in FIG. 5 will hereinafter be described in detail.

When a rising transition occurs in the output signal UDCP from the PC 21 under the condition that the clear terminals C1 and C2 of the D flip-flops 501 and 502 remain at a logical level "0", one of the outputs Q1 and Q2 of the D flip-flops 501 and 502 becomes logical "1" and the other becomes logical "0". When a rising transition occurs in the output DCP of the N-frequency divider 25 under the condition that one of the outputs Q1 and Q2 of the D flip-flops 501 and 502 is logical "1", one of the outputs Q3 and Q4 of the D flip-flops 503 and 504 becomes logical "1" and the other becomes logical "0". Since the outputs Q3 and Q4 of the D flip-flops 503 and 504 are connected to the inputs of the two-input OR gate 507 and the output of the two-input OR gate 507 is connected to the clock input CP5 of the D flip-flop 505 the data input D1 of which is logical "1", the output Q5 of the D flip-flop 505 becomes logical "1", thereby causing the D flip-flops 501 and 502 to be cleared. The clearing of the D flip-flops 501 and 502 results in a logical level "1" at the output of the two-input NOR gate 506 the inputs of which are connected to the outputs Q1 and Q2 of the D flip-flops 501 and 502. The logical "1" output of the two-input NOR gate 506 clears the D flip-flop 505, thereby to release the clearing of the D flip-flops 501 and 502.

When a period of the clock pulse of the output DCP of the N-frequency divider 25 has elapsed under the condition that one of the outputs Q3 and Q4 of the D flip-flops 503 and 504 is logical "0", pulses are sequentially outputted from the outputs Q2$l$–Q2$n$ of the n-bit shift register 500 and all then ORed in the n-input OR gate 508. As a result, the output of the n-input OR gate 508 clears the D flip-flops 503 and 504. At this time, the clearing of the D flip-flops 503 and 504 is performed for n periods of the clock pulse of the output DCP of the N-frequency divider 25. This results in a proper control of the PC gain.

Accordingly, although the rising transitions frequently occur in the output UDCP of the PC 21 (a large number of transitions are present in the received NRZ data), pulse generation periods at the outputs Q3 and Q4 of the D flip-flops 503 and 504 connected through the output buffers U and D to the outputs U and D of the first gain controller 22 are limited to the minimum pulse generation period ($T_{MIN}$=(n2)×DCP period) and the output pulses therefrom have a width of a period of the output DCP of the N-frequency divider 25. In other words, in the case where a density of the received NRZ data transitions is greater than or equal to 1/((n+2)×N), the PC gain is limited to that when the density of the received NRZ data transitions is 1/((n+2)×N). On the other hand, when the density of the received NRZ data transitions is smaller than 1/((n+2)×N), the PC gain is not limited. The optimum values of the dividing factor N of the N-frequency divider 25 and the bit number n of the n-bit shift register 500 can be determined in consideration of the bit rate and pattern of the received NRZ data and the loop gain of the PLL.

Figure 6A:
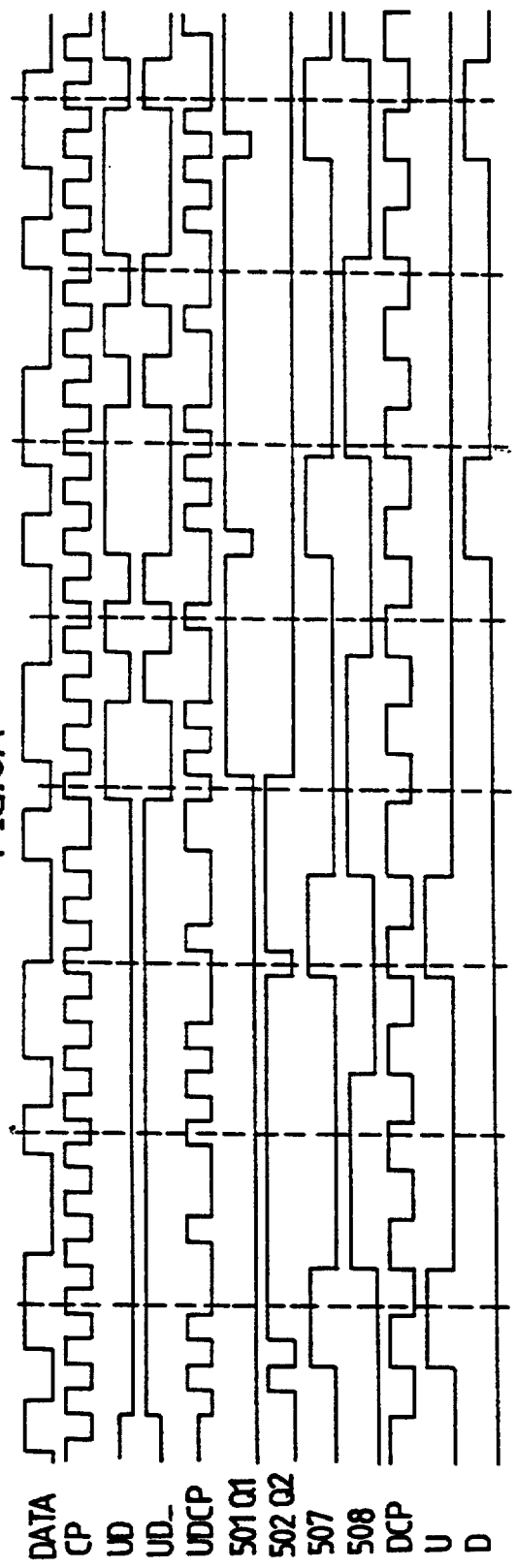
FIGS. 6A and 6B are timing diagrams of signals from components in the first gain controller in FIG. 5.
Figure 6B:
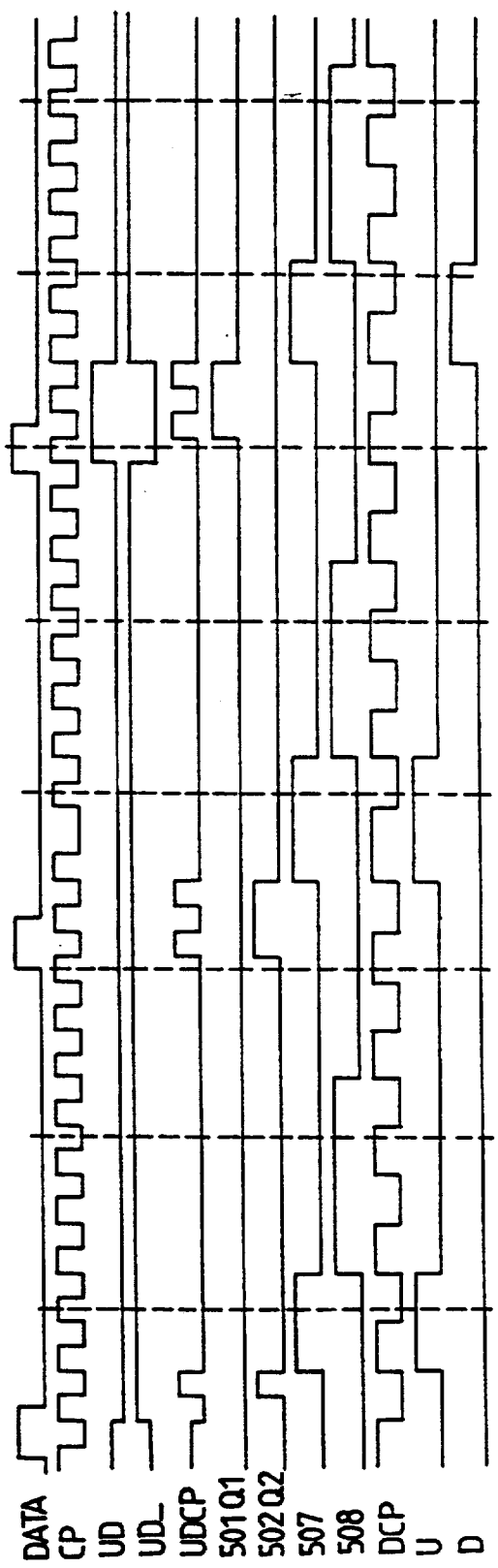

FIGS. 6A and 6B are timing diagrams of the signals from the components in the first gain controller 22 in FIG. 5. In these drawings, it is assumed that the bit number n of the n-bit shift register 500 is 2 and the output DCP of the N-frequency divider 25 is one-half the clock pulse CP of the VCO 27, i.e., N=2.

More particularly, FIG. 6A is a timing diagram when the outputs UD, /UD and UDCP from the PC 21 as shown in FIGS. 4A and 4B are inputted to the first gain controller 22 in the case where the probability that the NRZ data transitions will occur is below ½ and the rising transition of the clock pulse CP from the VCO 27 follows or precedes the center of the NRZ data "eye".

FIG. 6B is a timing diagram when the outputs UD, /UD and UDCP from the PC 21 as shown in FIGS. 4A and 4B are inputted to the first gain control let 22 in the case where the probability that the NRZ data transitions will occur is 1/10 and the rising transition of the clock pulse CP from the VCO 27 follows or precedes the center of the NRZ data "eye".

Figure 7:
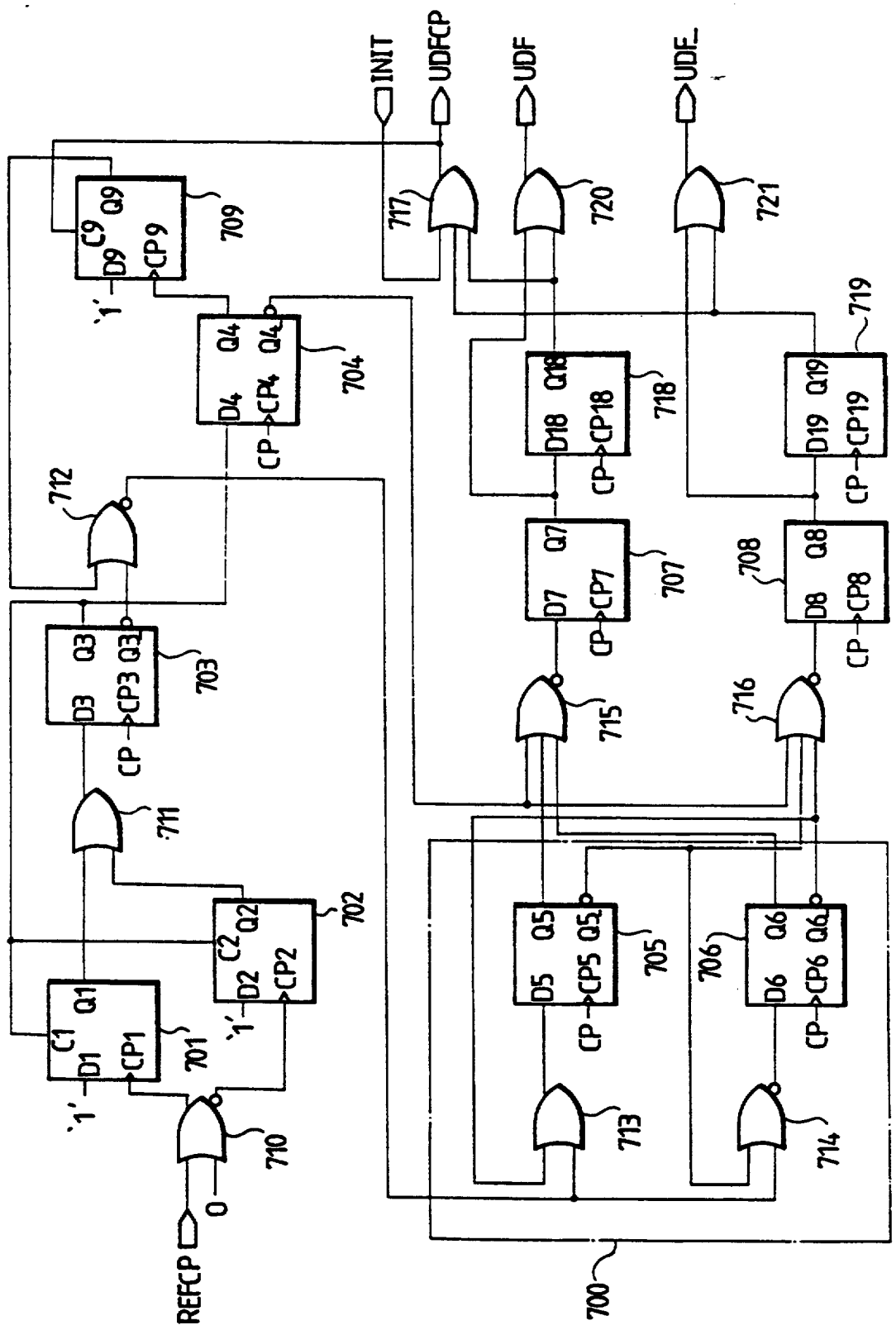
FIG. 7 is a functional block diagram of a frequency comparator in FIG. 2.

Referring to FIG. 7, there is shown a functional block diagram of the FC 23 in FIG. 2. In this drawing, the FC 23 is shown to include D flip-flops 701–709, 718 and 719, a two-input OR and NOR gate 710, two-input NOR gates 712 and 714, two-input OR gates 711, 713, 720 and 721, three-input NOR gates 715 and 716 and a three-input OR gate 717. The D flip-flops 705 and 706, the two-input OR gate 713 and the two-input NOR gate 714 constitute a two-bit synchronous counter 700 for a high speed operation.

The two-input OR and NOR gate 710 has its one input terminal for inputting the reference clock pulse REFCP and its other input terminal fixed at a logical level "0".

The D flip-flop 701 has its clock pulse input terminal CP1 for inputting an ORed output of the two-input OR and NOR gate 710 and its data input terminal D1 fixed at a logical level "1".

The D flip-flop 702 has its clock pulse input terminal CP2 for inputting an NORed output of the two-input OR and NOR gate 710 and its data input terminal D2 fixed at a logical level "1".

The two-input OR gate 711 inputs outputs Q1 and Q2 of the D flip-flops 701 and 702 at its two input terminals, respectively.

The D flip-flop 703 has its data input terminal D3 for inputting an output of the two-input OR gate 711, its clock pulse input terminal CP3 for inputting the output CP of the VCO 27 and its output Q3 connected to clear input terminals C1 and C2 of the D flip-flops 701 and 702.

The two-input NOR gate 712 inputs a negative output /Q3 of the D flip-flop 703 at its one input terminal.

The D flip-flop 704 has its data input terminal D4 for inputting the output Q3 of the D flip-flop 703 and its clock pulse input terminal CP4 for inputting the output CP of the VCO 27.

The two-input OR gate 713 inputs an output of the two-input NOR gate 712 at its one input terminal.

The D flip-flop 705 has its data input terminal D5 for inputting an output of the two-input OR gate 713 and its clock pulse input terminal CP5 for inputting the output CP of the VCO 27.

The two-input NOR gate 714 has its one input terminal for inputting the output of the two-input NOR gate 712 and its other input terminal for inputting a negative output /Q5 of the D flip-flop 705.

The D flip-flop 706 has its data input terminal D6 for inputting an output of the two-input NOR gate 714, its clock pulse input terminal CP6 for inputting the output CP of the VCO 27 and its negative output /Q6 connected to the other input terminal of the two-input OR gate 713.

The three-input NOR gate 715 has its first input terminal for inputting a negative output /Q4 of the D flip-flop 704, its second input terminal for inputting an output Q5 of the D flip-flop 705 and its third input terminal for inputting an output Q6 of the D flip-flop 706.

The three-input NOR gate 716 has its first input terminal for inputting the negative output /Q4 of the D flip-flop 704, its second input terminal for inputting negative output /Q5 of the D flip-flop 705 and its third input terminal for inputting a negative output /Q6 of the D flip-flop 706.

The D flip-flop 707 has its data input terminal D7 for inputting an output of the three-input NOR gate 715 and its clock pulse input terminal CP7 for inputting the output CP of the VCO 27.

The D flip-flop 708 has its data input terminal D8 for inputting an output of the three-input NOR gate 716 and its clock pulse input terminal CP8 for inputting the output CP of the VCO 27.

The D flip-flop 709 has its clock pulse input terminal CP9 for inputting an output Q4 of the D flip-flop 704, its data input terminal D9 fixed at a logical level "1" and its output Q9 connected to the other input terminal of the two-input NOR gate 712.

The D flip-flop 719 has its data input terminal D18 for inputting an output Q7 of the D flip-flop 707 and its clock pulse input terminal CP18 fan inputting the output CP of the VCO 27.

The D flip-flop 719 has its data input terminal D19 for inputting an output Q8 of the-D flip-flop 708 and its clock pulse input terminal CP19 for inputting the output CP of the VCO 27.

The three-input OR gate 717 has its first input terminal for inputting an output Q18 of the D flip-flop 718, its second input terminal for inputting an output Q19 of the D flip-flop 719, its third input terminal for inputting an external initialization signal INIT and its output UDFCP connected to a clear input terminal C9 of the D flip-flop 709 and to the input of the second gain controller 24.

The two-input OR gate 720 has its one input terminal for inputting the output Q7 of the D flip-flop 707, its other input terminal for inputting the output Q18 of the D flip-flop 718 and its output UDF connected to the input of the second gain controller 24.

The two-input OR gate 721 has its one input terminal for inputting the output Q8 of the D flip-flop 708, its other input terminal for inputting the output Q19 of the D flip-flop 719 and its output /UDF connected to the input of the second gain controller 24.

The operation of the FC 23 of the construction in FIG. 7 will hereinafter be described in detail.

Upon receiving the external reference clock pulse REFCP, the two-input OR and NOR gate 710 generates clock pulses which are in phase and 180° out of phase with the reference clock pulse REFCP, respectively. A logical level "1" is latched into the D flip-flops 701 and 702 whenever a transition occurs in the reference clock pulse REFCP. The outputs Q1 and Q2 of the D flip-flops 701 and 702 are ORed in the two-input OR gate 711, which outputs the ORed data to the D flip-flop 703. The D flip-flop 703 latches the ORed data from the two-input OR gate 711 upon a rising transition of the output CP of the VCO 27. The logical "1" output Q3 of the D flip-flop 703 clears the D flip-flops 701 and 702. Outputted from the output Q3 of the D flip-flop 703 is a pulse having a width of a period of the output clock pulse CP from the VCO 27 whenever the transition occurs in the reference clock pulse REFCP. Namely, outputted from the output Q3 of the D flip-flop 703 is the pulse having the width of a period of the output clock pulse CP from the VCO 27 every one-half period of the reference clock pulse REFCP. Since the D flip-flop 709 is initialized (the output Q9 is logical "0"), the one input of the two-input NOR gate 712 is logical "0". As a result, the two-input NOR gate 712 outputs the pulse from the output Q3 of the D flip-flop 703. The output pulse from the two-input NOR gate 712 is then applied to the two-input OR gate 713 and the two-input NOR gate 714 in the two-bit synchronous counter 700, thereby causing the two-bit synchronous counter 700 to be loaded with 1 (the decimal notation, Q5=LSB and Q6=MSB). After the lapse of a period of the output clock pulse CP from the VCO 27 under the condition on that the output of the two-input NOR gate 712 is logical "1", outputted from the output Q4 of the D flip-flop 704 is a pulse having a width of a period of the output clock pulse CP from the VCO 27, which is then applied to the clock pulse input terminal CP9 of the D flip-flop 709, thereby causing the two-bit synchronous counter 700 not to be loaded until the D flip-flop 709 is cleared.

The two-bit synchronous counter 700 performs repeatedly the sequential counting operation such as, for example, 1, 3, 2, 0, 1, 3, 2, 0, ... until it is again loaded. Then when the output Q4 of the D flip-flop 704 is logical "1", the combination value of the outputs Q5 and Q6 of the two-bit synchronous counter 700 becomes 0 (the decimal notation). As mentioned above, the D flip-flop 704 outputs at its output Q4 the pulse having the width of a period of the output clock pulse CP from the VCO 27 every one-half period of the reference clock pulse REFCP and the two-bit synchronous counter 700 performs the counting operation synchronously with the output Q3 of the D flip-flop 703. As a result, provided that K times (K is a natural number) one-half period of the reference clock pulse REFCP is 4 KM times (M is a natural number) a period of the output clock pulse CP from the VCO 27, the combination value of the outputs Q5 and Q6 of the two-bit synchronous counter 700 becomes 1 (the decimal notation) whenever the pulse is generated at the output Q4 of the D flip-flop 704.

Provided that the K times one-half period of the reference clock pulse REFCP is above the 4 KM times a period of the output clock pulse CP from the VCO 27, the combination value of the outputs Q5 and Q6 of the two-bit synchronous counter 700 becomes 1 or 0 (the decimal notation) whenever the pulse is generated at the output Q4 of the D flip-flop 704. In this case, the frequency that the combination value of the outputs Q5 and Q6 of the two-bit synchronous counter 700 becomes 0 (the decimal notation) is in proportion to a difference between the K times one-half period of the reference clock pulse REFCP and the 4 KM times a period of the output clock pulse CP from the VCO 27. Also provided that the K times one-half period of the reference clock pulse REFCP is below the 4 KM times a period of the output clock pulse CP from the VCO 27, the combination value of the outputs Q5 and Q6 of the two-bit synchronous counter 700 becomes 1 or 3 (the decimal notation) whenever the pulse is generated at the output Q4 of the D flip-flop 704. In this case, the frequency that the combination value of the outputs Q5 and Q6 of the two-bit synchronous counter 700 becomes 3 (the decimal notation) is in proportion to the difference between the K times one-half period of the reference clock pulse REFCP and the 4 KM times a period of the output clock pulse CP from the VCO 27. When the output of the two-bit synchronous counter is 0 and the pulse is generated at the output Q4 of the D flip-flop 704, the output of the three-input NOR gate 715 becomes logical "1". When the output of the two-bit synchronous counter is 3 and the pulse is generated at the output Q4 of the D flip-flop 704, the output of the three-input NOR gate 716 becomes logical "1".

Hence, when the K times one-half period of the reference clock pulse REFCP is above the 4 KM times a period of the output clock pulse CP from the VCO 27 (4 KM + 1), the D flip-flop 707 outputs at its output Q7 a pulse having a width of a period of the output clock pulse CP from the VCO 27. On the other hand, when the K times one-half period of the reference clock pulse REFCP is below the 4 KM times a period of the output clock pulse CP from the VCO 27 (4 KM − 1), the D flip-flop 708 outputs at its output Q8 a pulse having a width of a period of the output clock pulse CP from the VCO 27. The pulses from the outputs Q7 and Q8 of the D flip-flops 707 and 708 appear at the outputs Q18 and Q19 of the D flip-flops 718 and 719, being delayed by a period of the output clock pulse CP from the VCO 27. In this connection, provided that the K times a period of the reference clock pulse REFCP is above the 8 KM times a period of the output clock pulse CP from the VCO 27, the two-input OR gate 720 outputs a pulse (UDF) having a width of two periods of the output clock pulse CP from the VCO 27. On the other hand, provided that the K times a period of the reference clock pulse REFCP is below the 8 KM times a period of the output clock pulse CP from the VCO 27, the two-input OR gate 721 outputs a pulse (/UDF) having a width of two periods of the output clock pulse CP from the VCO 27.

Since the three-input OR gate 717 is connected to the outputs Q18 and Q19 of the D flip-flops 718 and 719 and to the initialization signal INIT, the output thereof becomes logical "1" when power is supplied thereto or the pulse is generated at at least one of the outputs Q18 and Q19 of the D flip-flops 718 and 719. The logical "1" output of the three-input OR gate 717 clears the D flip-flop 709, thereby causing the two-bit synchronous counter 700 to be loaded. Also when the pulse UDF or /UDF is generated at at least one of the outputs of the two-input OR gates 720 and 721, the three-input OR gate 717 outputs to the second gain control let 24 a pulse (UDFCP) having a rising edge in the center of a pulse width thereof.

Figure 8A:
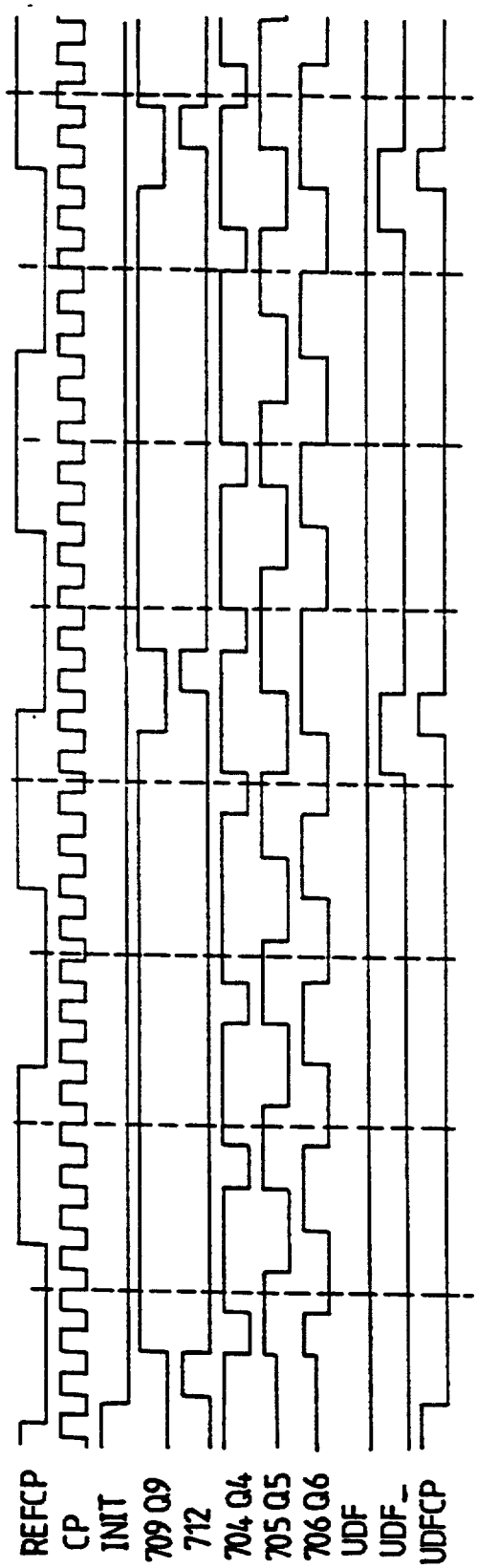
FIGS. 8A and 8B are timing diagrams of signals from components in the frequency comparator in FIG. 7.
Figure 8B:
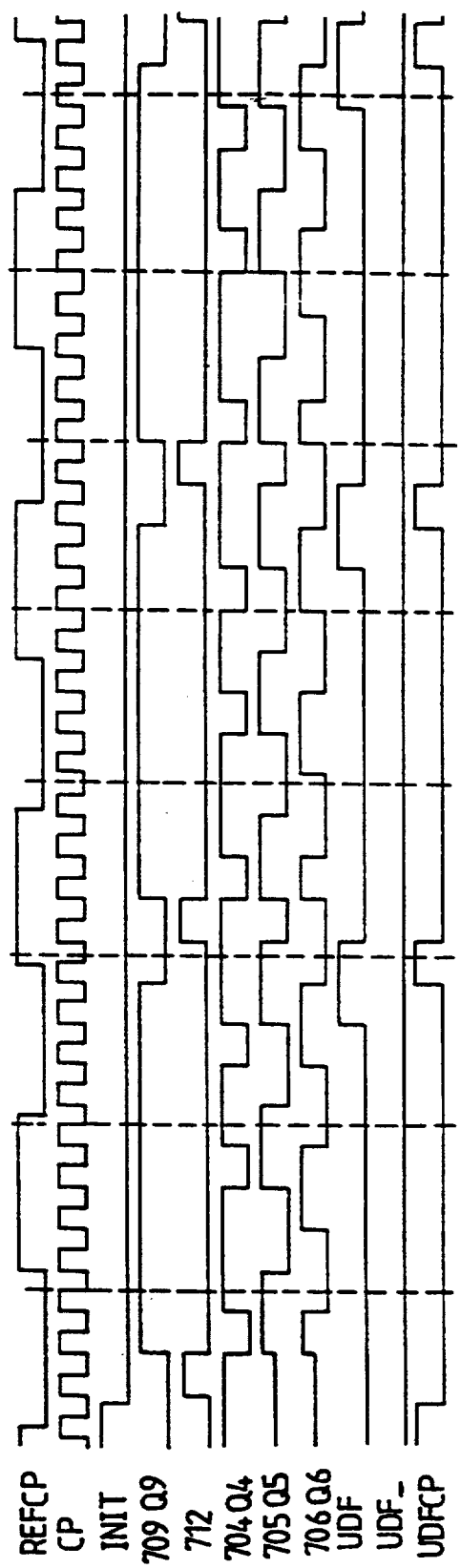

FIGS. 8A and 8B are timing diagrams of the signals from the components in the FC 23 in FIG. 7 in the case where the M is 4 and the K is 3. More particularly, FIG. 8A is a timing diagram when 3 times one-half period of the reference clock pulse REFCP is above 12 times a period of the output clock pulse CP from the VCO 27 and FIG. 8B is a timing diagram when 3 times one-half period of the reference clock pulse REFCP is below 12 times a period of the output clock pulse CP from the VCO 27.

Figure 9:
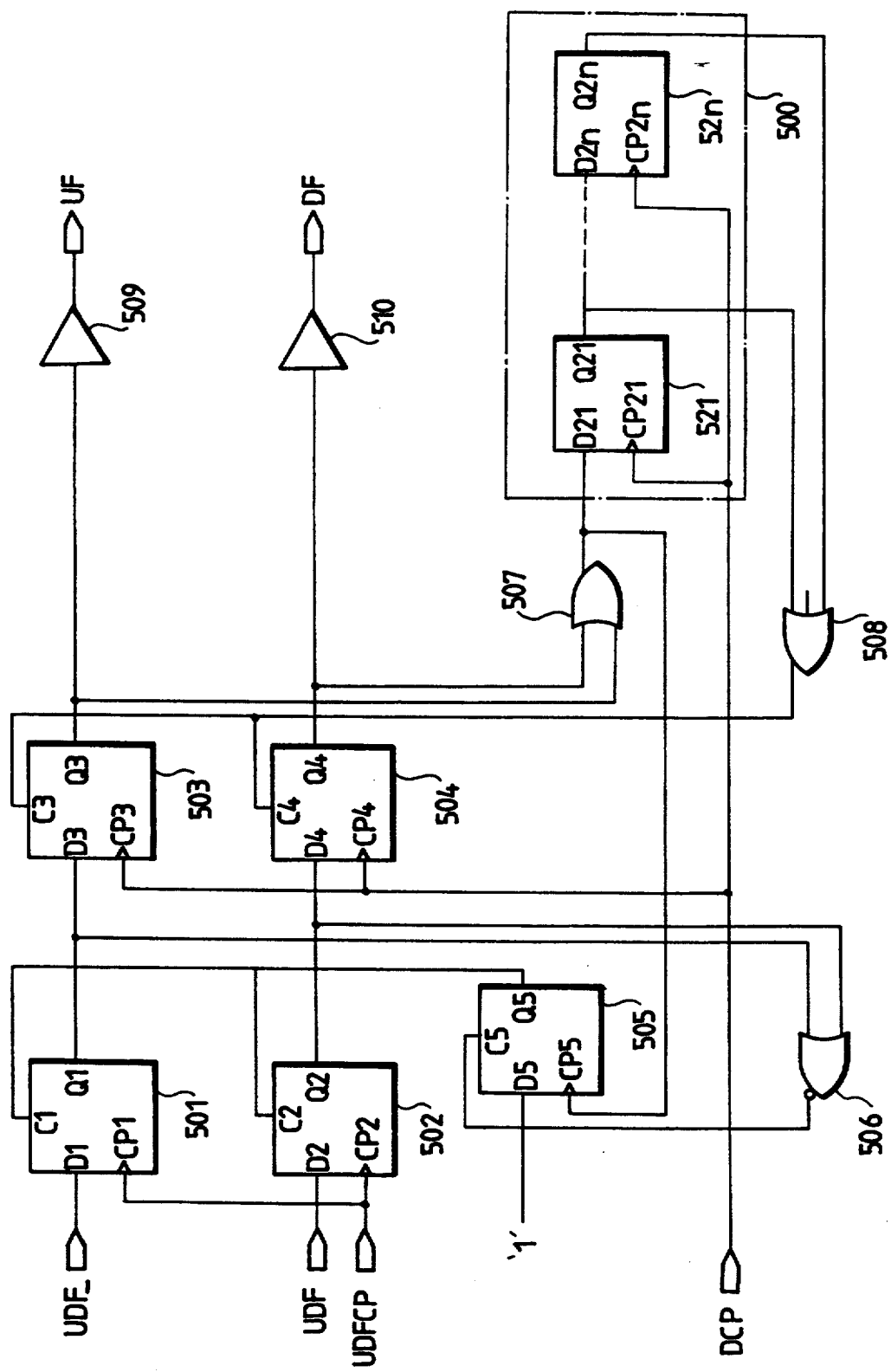
FIG. 9 is a functional block diagram of a second gain controller in FIG. 2.

Referring to FIG. 9, there is shown a functional block diagram of the second gain controller 24 in FIG. 2. In this drawing, like reference numerals indicate like parts as compared with FIG. 5, since the construction of the second gain controller 24 is substantially the same as that of the first gain controller 22. As shown in FIG. 9, the second gain controller 24 includes a n-bit (n is a natural number) shift register 500, D flip-flops 501–505, a two-input NOR gate 506, a two-input OR gate 507, a n-input (n is a natural number) OR gate 508 and output buffers 509 and 510.

The D flip-flop 502 has its data input terminal D2 for inputting the output UDF of the two-input OR gate 720 in the FC 23 and its clock pulse input terminal CP2 for inputting the output UDFCP of the three-input OR gate 717 in the FC 23.

The D flip-flop 501 has its data input terminal D1 for inputting the output /UDF of the two-input OR gate 721 in the FC 23 and its clock pulse input terminal CP1 for inputting the output UDFCP of the three-input OR gate 717 in the FC 23.

The output buffer 509 has its input terminal for inputting an output Q3 of the D flip-flop 503 and its output UF connected to the input of the low pass filter (or the integrator) 26.

The output buffer 510 has its input terminal for inputting an output Q4 of the D flip-flop 504 and its output DF connected to the input of the low pass filter (or the integrator) 26.

The remainder of the construction of the second gain controller 24, not described, and the operation thereof are the same as those of the first gain controller 22 and a description thereof will thus be omitted.

As hereinbefore described, according to the present, invention, there is provided the bit, synchronizer wherein the loop gain of the PLL is not, varied sensitively to the bit, pattern and rate of the received NRZ data and the NRZ data and clock can be recovered stably over a wide range of variation of the clock frequency of the VCO. The present invention can provide the following advantages.

First, since the loop gain of the PLL is not varied sensitively to the bit pattern and rate of the received NRZ data, an excellent bit synchronization performance can be obtained when the present invention is applied to NRZ bit, synchronizing environments with no use of line codes.

Second, since the width of the output pulse from the PC can be controlled freely, a stable bit synchronization can be performed in a high speed data transmission (above 500 Mbps).

Third, a stable bit, synchronization can be performed even over a wide range of variation of the clock frequency of the VCO and a frequency stability of the VCO can be controlled based on the external reference clock pulse when the VCO free-runs.

Fourth, making the period of the clock pulse from the N-frequency divider constant results in the low pass filter or integrator having a fixed time constant irrelevant to the bit pattern and rate of the received NRZ data thereby enabling a stable bit synchronization.

Although the preferred embodiments of the present invention have been disclosed for illustrative purpose, those skilled in the art will appreciate that various modifications, additions and substitutions are possible, without departing from the scope and spirit of the invention as disclosed in the accompanying claims.

What is claimed is:

1. A bit synchronizer for NRZ data comprising:
   voltage controlled oscillating means;
   phase comparing means for comparing a phase of a transition of the received NRZ data with a phase of a rising transition of a clock pulse from said voltage controlled oscillating means being synchronized with the NRZ data bit, outputting the resultant pulse information only when the transition is present in the received NRZ data, retiming the NRZ data at the bit synchronized clock pulse of said voltage controlled oscillating means and outputting the retimed NRZ data;
   first gain control means connected to said phase comparing means, said first gain control means limiting a gain of said phase comparing means to a predetermined value when the gain of said phase comparing means is greater than or equal to the predetermined value since a density of the NRZ data transitions is greater than or equal to a predetermined probability, not limiting the gain of said phase comparing means when the gain of said phase comparing means is smaller than the predetermined value since the density of the NRZ data transitions is smaller than the predetermined probability, wave-shaping the pulse information from said phase comparing means into a pulse waveform having a pulse width irrelevant to a bit rate of the NRZ data and outputting the wave-shaped pulse signal;
   frequency comparing means for comparing a multiple of one-half period of an external reference clock pulse with a multiple of a period of the clock pulse from said voltage controlled oscillating means and outputting the resultant pulse information only when a transition is present in the reference clock pulse;
   second gain control means connected to said frequency comparing means, said second gain control means limiting a gain of said frequency comparing means to a predetermined value when the gain of said frequency comparing means is greater than or equal to the predetermined value, not limiting the gain of said frequency comparing means when the gain of said frequency comparing means is smaller than the predetermined value, wave-shaping the pulse information from said frequency comparing means into a pulse waveform having a pulse width irrelevant to a frequency of the reference clock pulse and a frequency of the clock pulse from said voltage controlled oscillating means and outputting the wave-shaped pulse signal;
   means connected to said first and second gain control means, for low pass filtering or integrating outputs of said first and second gain control means;
   said voltage controlled oscillating means changing the phase and frequency of the clock pulse thereof in response to an output voltage from said low pass filtering or integrating means and outputting the resultant clock pulse to said phase comparing means and said frequency comparing means; and
   N-frequency dividing means connected to said voltage controlled oscillating means and said first and second gain control means, said N-frequency dividing means dividing the clock pulse from said voltage controlled oscillating means by N (natural number) and outputting the resultant clock pulse to said first and second gain control means.

2. A bit synchronizer for NRZ data, as set forth in claim 1, wherein said phase comparing means performs the comparison operation to determine whether the rising transition of the clock pulse from said voltage controlled oscillating means precedes or follows the center of the received NRZ data "eye", outputs the resultant pulse information as a logical level and a latch clock pulse for latching the logical level only when the transition is present in the received NRZ data, retirees the NRZ data at the bit synchronized clock pulse of said voltage controlled oscillating means and outputs the retimed NRZ data.

3. A bit synchronizer for NRZ data, as set forth in claim 1, wherein said frequency comparing means performs the comparison operation to determine whether K (natural number) times one-half period of the reference clock pulse is 4 KM(natural number)+1 times or 4 KM−1 times a period of the clock pulse from said voltage controlled oscillating means and outputs the resultant pulse information as a logical level and a latch clock pulse for latching the logical level only when the transition is present in the reference clock pulse.

4. A bit synchronizer for NRZ data, as set forth in claim 2, wherein said phase comparing means includes:
   a two-input OR and NOR gate having its one input terminal for inputting the output from said voltage controlled oscillating means and its other input terminal fixed at a logical level "0";
   a first D flip-flop having its data input terminal for inputting the NRZ data and its clock pulse input terminal for inputting a clock pulse from said two-input OR and NOR gate, the clock pulse being in phase with the output from said voltage controlled oscillating means;

a second D flip-flop having its data input terminal for inputting the NRZ data and its clock pulse input terminal for inputting a clock pulse from said two-input OR and NOR gate, the clock pulse being 180° out of phase with the output from said voltage controlled oscillating means;

a third D flip-flop having its data input terminal for inputting an output of said second D flip-flop and its clock pulse input terminal for inputting the clock pulse from said two-input OR and NOR gate which is in phase with the output from said voltage controlled oscillating means;

a fourth D flip-flop having its data input terminal for inputting an output of said first D flip-flop and its clock pulse input terminal for inputting the clock pulse from said two-input OR and NOR gate which is in phase with the output from said voltage controlled oscillating means;

an exclusive OR gate for inputting the output of said second D flip-flop and an output of said third D flip-flop at its two input terminals, respectively; and an exclusive OR and NOR gate for inputting the outputs of said first and third D flip-flops at its two input terminals, respectively;

said exclusive OR and NOR gate outputting the logical level indicative of the phase relationship between the rising transition of the clock pulse from said voltage controlled oscillating means and the center of the received NRZ data "eye"; and said exclusive OR gate outputting the latch clock pulse for latching the phase relationship indicative logical level.

5. A bit synchronizer for NRZ data, as set forth in claim 4, wherein said first gain control means includes:

a fifth D flip-flop having its data input terminal for inputting an exclusive NORed output of said exclusive OR and NOR gate in said phase comparing means and its clock pulse input terminal for inputting an output of said exclusive OR gate in said phase comparing means;

a sixth D flip-flop having its data input terminal for inputting an exclusive ORed output of said exclusive OR and NOR gate in said phase comparing means and its clock pulse input terminal for inputting the output of said exclusive OR gate in said phase comparing means;

a seventh D flip-flop having its data input terminal for inputting an output of said fifth D flip-flop and its clock pulse input terminal for inputting the output of said N-frequency dividing means;

an eighth D flip-flop having its data input terminal for inputting an output of said sixth D flip-flop and its clock pulse input terminal for inputting the output of said N-frequency dividing means;

a two-input NOR gate for inputting the outputs of said fifth and sixth D flip-flops at its two input terminals, respectively;

a two-input OR gate for inputting outputs of said seventh and eighth D flip-flops at its two input terminals, respectively;

a ninth D flip-flop having its clear input terminal for inputting an output of said two-input NOR gate, its clock pulse input terminal for inputting an output of said two-input OR gate, its data input terminal fixed at a logical level "1" and its output connected to clear input terminals of said fifth and sixth D flip-flops;

a n-bit shift register having n D flip-flops each having its data input terminal for inputting the output of said two-input OR gate and its clock pulse input terminal for inputting the output of said N-frequency dividing means;

a n-input OR gate having its n input terminals for inputting n outputs of said n-bit shift register and its output connected to clear input terminals of said seventh and eighth D flip-flops;

a first output buffer having its input terminal for inputting the output of said seventh D flip-flop and its output connected to said low pass filtering or integrating means; and a second output buffer having its input terminal for inputting the output of said eighth D flip-flop and its output connected to said low pass filtering or integrating means.

6. A bit synchronizer for NRZ data, as set forth in claim 3, wherein said frequency comparing means includes:

a two-input OR and NOR gate having its one input terminal for inputting the reference clock pulse and its other input terminal fixed at a logical level "0";

a first D flip-flop having its clock pulse input terminal for inputting an ORed output of said two-input OR and NOR gate and its data input terminal fixed at a logical level "1";

a second D flip-flop having its clock pulse input terminal for inputting an NORed output of said two-input OR and NOR gate and its data input terminal fixed at a logical level "1";

a first two-input OR gate for inputting outputs of said first and second D flip-flops at its two input terminals, respectively;

a third D flip-flop having its data input terminal for inputting an output of said first two-input OR gate, its clock pulse input terminal for inputting the output of said voltage controlled oscillating means and its output connected to clear input terminals of said first and second D flip-flops;

a first two-input NOR gate for inputting a negative output of said third D flip-flop at its one input terminal;

a fourth D flip-flop having its data input terminal for inputting the output of said third D flip-flop and its clock pulse input terminal for inputting the output of said voltage controlled oscillating means;

a second two-input OR gate for inputting an output of said first two-input NOR gate at its one input terminal;

a fifth D flip-flop having its data input terminal for inputting an output of said second two-input OR gate and its clock pulse input terminal for inputting the output of said voltage controlled oscillating means;

a second two-input NOR gate having its one input terminal for inputting the output of said first two-input NOR gate and its other input terminal for inputting a negative output of said fifth D flip-flop;

a sixth D flip-flop having its data input terminal for inputting an output of said second two-input NOR gate, its clock pulse input terminal for inputting the output of said voltage controlled oscillating means and its negative output connected to the other input terminal of said second two-input OR gate;

a first three-input NOR gate having its first input terminal for inputting a negative output of said fourth D flip-flop, its second input terminal for inputting an output of said fifth D flip-flop and its third input terminal for inputting an output of said sixth D flip-flop;

a second three-input NOR gate having its first input terminal for inputting the negative output of said fourth D flip-flop, its second input terminal for inputting the negative output of said fifth D flip-flop and its third input terminal for inputting a negative output of said sixth D flip-flop;

a seventh D flip-flop having its data input terminal for inputting an output of said first three-input NOR gate and its clock pulse input terminal for inputting the output of said voltage control led oscillating means;

an eighth D flip-flop having its data input terminal for inputting an output of said second three-input NOR gate and its clock pulse input terminal for inputting the output of said voltage controlled oscillating means;

a ninth D flip-flop having its clock pulse input terminal for inputting an output of said fourth D flip-flop, its data input terminal fixed at a logical level "1" and its output connected to the other input terminal of said first two-input NOR gate;

a tenth D flip-flop having its data input terminal for inputting an output of said seventh D flip-flop and its clock pulse input terminal for inputting the output of said voltage controlled oscillating means;

a eleventh D flip-flop having its data input terminal for inputting an output of said eighth D flip-flop and its clock pulse input terminal for inputting the output of said voltage controlled oscillating means;

a three-input OR gate having its first input terminal for inputting an output of said tenth D flip-flop, its second input terminal for inputting an output of said eleventh D flip-flop, its third input terminal for inputting an external initialization signal and its output connected to a clear input terminal of said ninth D flip-flop and to said second gain control means;

a third two-input OR gate having its one input terminal for inputting the output of said seventh D flip-flop, its other input terminal for inputting the output of said tenth D flip-flop and its output connected to said second gain control means; and a fourth two-input OR gate having its one input terminal for inputting the output of said eighth D flip-flop, its other input terminal for inputting the output of said eleventh D flip-flop and its output connected to said second gain control means.

7. A bit synchronizer for NRZ data, as set forth in claim 6, wherein said second gain control means includes:

a twelfth D flip-flop having its data input terminal for inputting the output of said third two-input OR gate in said frequency comparing means and its clock pulse input terminal for inputting the output of said three-input OR gate in said frequency comparing means;

a thirteenth D flip-flop having its data input terminal for inputting the output of said fourth two-input OR gate in said frequency comparing means and its clock pulse input terminal for inputting the output of said three-input OR gate in said frequency comparing means;

a fourteenth D flip-flop having its data input terminal for inputting an output of said thirteenth D flip-flop and its clock pulse input terminal for inputting the output of said N-frequency dividing means;

a fifteenth D flip-flop having its data, input terminal for inputting an output of said twelfth D flip-flop and its clock pulse input terminal for inputting the output of said N-frequency dividing means;

a third two-input NOR gate for inputting the outputs of said twelfth and thirteenth D flip-flops at its two input terminals, respectively;

a fifth two-input OR gate for inputting outputs of said fourteenth and fifteenth D flip-flops at its two input terminals, respectively;

a sixteenth D flip-flop having its clear input terminal for inputting an output of said third two-input NOR gate, its clock pulse input terminal for inputting an output of said fifth two-input OR gate, its data input terminal fixed at a logical level "1" and its output connected to clear input terminals of said twelfth and thirteenth D flip-flops;

a n-bit shift register having n D flip-flops each having its data input terminal for inputting the output of said fifth two-input OR gate and its clock pulse input terminal for inputting the output of said N-frequency divining means;

a n-input OR gate having its n input terminals for inputting n outputs of said n-bit shift register and its output connected to clear input terminals of said fourteenth and fifteenth D flip-flops;

a first output buffer having its input terminal for inputting the output of said fourteenth D flip-flop and its output connected to said low pass filtering or integrating means; and a second output buffer having its input terminal for inputting the output of said fifteenth D flip-flop and its output connected to said low pass filtering or integrating means.

8. A bit synchronizer for NRZ data comprising:

voltage controlled oscillating means;

phase comparing means for comparing a phase of a transition of the received NRZ data with a phase of a rising transition of a clock pulse from said voltage controlled oscillating means being synchronized with the NRZ data bit, outputting the resultant pulse information only when the transition is present in the received NRZ data, retiming the NRZ data at the bit synchronized clock pulse of said voltage controlled oscillating means and outputting the retimed NRZ data;

gain control means connected to said phase comparing means, said gain control means limiting a gain of said phase comparing means to a predetermined value when the gain of said phase comparing means is greater than or equal to the predetermined value since a density of the NRZ data transitions is greater than or equal to a predetermined probability, not limiting the gain of said phase comparing means when the gain of said phase comparing means is smaller than the predetermined value since the density of the NRZ data transitions is smaller than the predetermined probability, waveshaping the pulse information from said phase comparing means into a pulse waveform having a pulse width irrelevant to a bit rate of the NRZ data and outputting the wave-shaped pulse signal;

frequency comparing means for comparing a multiple of one-half period of an external reference clock pulse with a multiple of a period of the clock pulse from said voltage controlled oscillating means and outputting the resultant pulse information only when a transition is present in the reference clock pulse;

means connected to said gain control means and said frequency comparing means, for low pass filtering or integrating outputs of said gain control means and frequency comparing means;

said voltage controlled oscillating means changing the phase and frequency of the clock pulse thereof in response to an output voltage from said low pass filtering or integrating means and outputting the resultant clock pulse to said phase comparing means and said frequency comparing means; and N-frequency dividing means connected to said voltage controlled oscillating means, said gain control means and said frequency comparing means, said N-frequency-dividing means dividing the clock pulse from said voltage controlled oscillating means by N (natural number) and outputting the resultant clock pulse to said gain control means and said frequency comparing means.

9. A bit synchronizer for NRZ data comprising:

voltage controlled oscillating means;

phase comparing means for comparing a phase of a transition of the received NRZ data with a phase of a rising transition of a clock pulse from said voltage controlled oscillating means being synchronized with the NRZ data bit, outputting the resultant pulse information only when the transition is present in the received NRZ data, retiming the NRZ data at the bit synchronized clock pulse of said voltage controlled oscillating means and outputting the retimed NRZ data;

gain control means connected to said phase comparing means, said gain control means limiting a gain of said phase comparing means to a predetermined value when the gain of said phase comparing means is greater than or equal to the predetermined value since a density of the NRZ data transitions is greater than or equal to a predetermined probability, not limiting he gain of said phase comparing means when the gain of said phase comparing means is smaller than the predetermined value since the density of the NRZ data transitions is smaller than the predetermined probability waveshaping the pulse information from said phase comparing means into a pulse waveform having a pulse width irrelevant to a bit rate of the NRZ data and outputting the wave-shaped pulse signal;

means connected to said gain control means, for low pass filtering or integrating an output of said gain control means;

said voltage controlled oscillating means changing the phase and frequency of the clock pulse thereof in response to an output voltage from said low pass filtering or integrating means and outputting the resultant clock pulse to said phase comparing means; and N-frequency dividing means connected to said voltage controlled oscillating means and said gain control means, said N-frequency dividing means dividing the clock pulse from said voltage controlled oscillating means by N (natural number) and outputting the resultant clock pulse to said gain control means.

* * * * *

UNITED STATES PATENT AND TRADEMARK OFFICE
CERTIFICATE OF CORRECTION

PATENT NO. : 5,430,772
DATED : July 4, 1995
INVENTOR(S) : Lee et al.

It is certified that error appears in the above-identified patent and that said Letters Patent is hereby corrected as shown below:

On title page, item

[73] Assignees change "Krea Telecommunication Authority" to --Korea Telecommunication Authority--.

Signed and Sealed this

Twenty-seventh Day of February, 1996

Attest:

BRUCE LEHMAN

Attesting Officer           Commissioner of Patents and Trademarks